United States Patent
Patti

(10) Patent No.: US 6,271,587 B1
(45) Date of Patent: Aug. 7, 2001

(54) CONNECTION ARRANGEMENT FOR ENBALING THE USE OF IDENTICAL CHIPS IN 3-DIMENSIONAL STACKS OF CHIPS REQUIRING ADDRESS SPECIFIC TO EACH CHIP

(76) Inventor: Robert Patti, 1 S. 751 Avon Dr., Warrenville, IL (US) 60555

( * ) Notice: Subject to any disclaimer, the term of this patent is extended or adjusted under 35 U.S.C. 154(b) by 0 days.

(21) Appl. No.: 09/396,634

(22) Filed: Sep. 15, 1999

(51) Int. Cl.⁷ .................................................. H01L 23/34
(52) U.S. Cl. .......................... 257/724; 257/686; 257/723; 257/685; 110/104; 395/800; 364/238
(58) Field of Search ..................................... 257/686, 723, 257/720, 685; 710/104; 395/800; 364/238

(56) References Cited

U.S. PATENT DOCUMENTS 5,261,115 * 11/1993 Saunders et al. ..................... 395/800

* cited by examiner

Primary Examiner—Minh Loan Tran
Assistant Examiner—Luan Thai
(74) Attorney, Agent, or Firm—Calvin B. Ward

(57) ABSTRACT

An integrated circuit having first and second identical layers of circuitry. Each layer includes a substrate having a plurality of components thereon. Each layer also includes circuit selection circuitry for enabling the integrated circuit components on that layer to perform a predetermined function. The circuit selection circuitry includes a circuit selection terminal for receiving a signal that enables the predetermined function. Each layer also includes N input pads and N output pads, where N>1. The input and output pads are labeled from 1 to N. Each input pad is connected to a corresponding one of the output pads. The connection scheme is chosen such that there is a one-to-one mapping between the input pads and the output pads and no input pad is connected to an output pad on that layer having the same label as the input pad. The circuit selection terminal is connected to a predetermined one of the input pads. The layers are connected such that the input pad labeled k on the second layer is connected to the output pad labeled k on the first layer for k=1 to N.

4 Claims, 1 Drawing Sheet

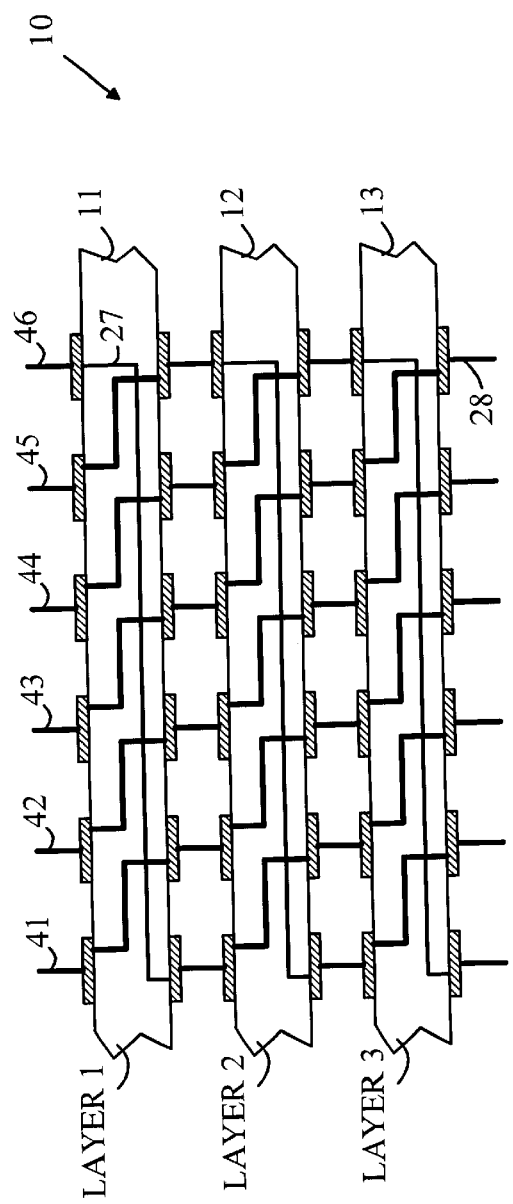
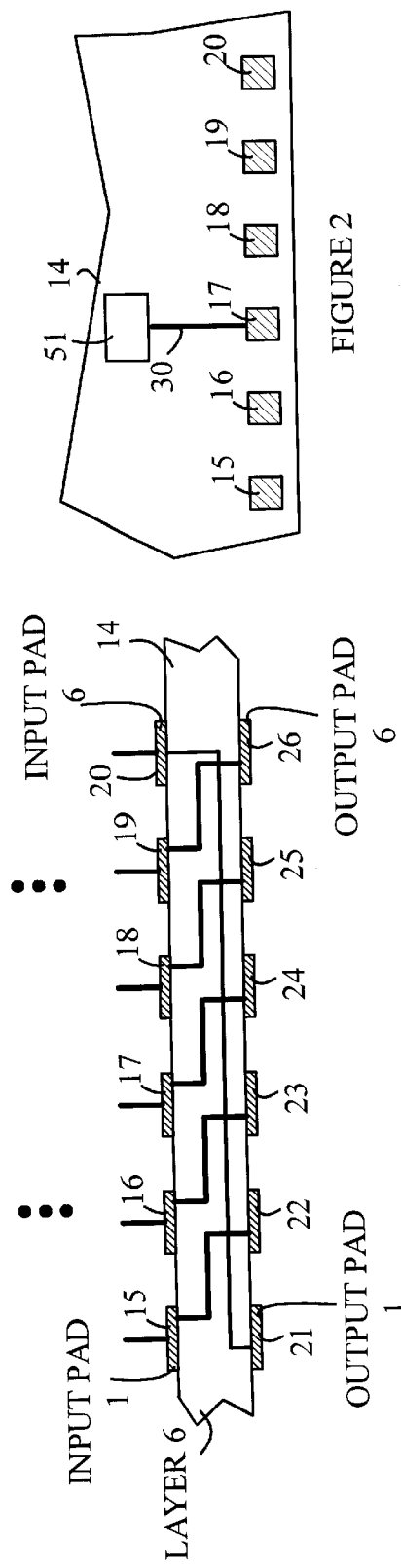
FIGURE 1
FIGURE 2

CONNECTION ARRANGEMENT FOR ENBALING THE USE OF IDENTICAL CHIPS IN 3-DIMENSIONAL STACKS OF CHIPS REQUIRING ADDRESS SPECIFIC TO EACH CHIP

FIELD OF THE INVENTION

The present invention relates to circuits constructed from stacks of identical chips, and more particularly, to a method for providing chip enablement signals that does not require alterations in the chips.

BACKGROUND OF THE INVENTION

Consider a circuit such as a computer memory that is constructed from layers of planar arrays of memory cells that are stacked to form a 3-dimensional memory. The layers may be individual integrated circuit chips or traditional circuit boards. The layers are typically connected by a number of vertical connect lines. Typically, there is an address associated with each layer and an enablement line that connects that layer to one or more of the vertical connect lines when the cells thereon are being selected.

There are two basic methods for selecting a layer. In the first method, the address of the selected layer can be communicated on a subset of the vertical connect lines and be decoded on the layer. The decoded address is then compared to an address stored on the layer, and if the addresses match, the enablement line is energized. This method requires that each layer be programmed with its specific address prior to being connected in the stack. Hence, the layers are not identical. In addition, the ROM needed to store the address may require a different fabrication technology than the remaining circuitry on the layer. This is particularly important in the cases in which the layers are individual semiconductor chips, since mixing devices constructed with different fabrication processes is not always possible.

The second method places the decoding circuitry on a different layer. In this case, each layer must have an enablement connection in the vertical connect lines. The vertical connected select lines must be distinct and each layer must "know" which line corresponds to that layer while being identical to every other layer. No prior art solution to this problem is known that does not require programming bits on each layer to make that layer unique.

Broadly, it is the object of the present invention to provide an improved layer select arrangement in a circuit constructed from a plurality of identical circuit layers.

It is a further object of the present invention to provide a layer select method that does not require each layer to be separately programmed with an address.

These and other objects of the present invention will become apparent to those skilled in the art from the following detailed description of the invention and the accompanying drawings.

SUMMARY OF THE INVENTION

The present invention is an integrated circuit having first and second identical layers of circuitry. Each layer includes a substrate having a plurality of components thereon. Each layer also includes circuit selection circuitry for enabling the integrated circuit components on that layer to perform a predetermined function. The circuit selection circuitry includes a circuit selection terminal for receiving a signal that enables the predetermined function. Each layer also includes N input pads and N output pads, where N>1. The input and output pads are labeled from 1 to N. Each input pad is connected to a corresponding one of the output pads. The connection scheme is chosen such that there is a one-to-one mapping between the input pads and the output pads and no input pad is connected to an output pad on that layer having the same label as the input pad. The circuit selection terminal is connected to a predetermined one of the input pads. The layers are connected such that the input pad labeled k on the second layer is connected to the output pad labeled k on the first layer for k=1 to N.

BRIEF DESCRIPTION OF THE DRAWINGS

FIG. 1 is a side view of the portion of a stack of circuit layers that provides the layer addressing function.

FIG. 2 is a top view of a portion of layer 14.

DETAILED DESCRIPTION OF THE INVENTION

The present invention may be more easily understood with reference to FIGS. 1 and 2. FIG. 1 is a side view of the portion of a stack 10 of circuit layers that provides the layer addressing function. FIG. 2 is a top view of a portion of layer 14. Each layer in the stack has a plurality of input and output address pads. Exemplary input address pads are shown at 15–20, and the corresponding output address pads are shown at 21–26. In the example shown in FIGS. 1 and 2 there are 6 input address pads and 6 output address pads on each layer.

To simplify the following discussion, the input pads on each layer are numbered from 1 to 6. Input pad 15 corresponds to pad 1 on layer 14 and input pad 20 corresponds to pad 6 on that layer. Similarly, the output pads will be labeled from 1 to 6 with output pad 21 corresponding to pad 1. Similarly, the layers will be numbered from one to 6 as shown in FIG. 1.

The layers are connected such that the $k^{th}$ output pad on layer n is connected to the $k^{th}$ input pad on layer n+1 for k=1 to 6 and n=1 to 5. The connections can be implemented by bonding the layers together using thermal diffusion bonding applied to the corresponding input and output pads. Hence, the present invention is particularly adapted for use in 3-dimensional circuits constructed by bonding a plurality of circuit layers together.

The input pads on layer 1 are connected to the layer select lines shown at 41–46. The output pads on layer 6 are preferably connected to impedance terminating circuits.

On each layer, the $k^{th}$ input pad is connected to the $(k+1)^{st}$ output pad for k=1 to 5. The $6^{th}$ input pad is connected to the first output pad as indicated by the connection 27 shown on layer 11.

One of the input pads on each layer serves the function of layer select. In the example shown in the Figures input pad 3 provides this function. A signal received on input pad 3 is communicated to the layer select circuitry 51 via line 30. It should be noted that the same pad is used in each layer; hence, all of the layers are identical. The remaining input pads are generally not connected to circuitry on the layer other than that needed to make the connections to the corresponding output pads.

The number of input address pads, or output address pads, determines the maximum number of layers that can be addressed. A layer is addressed by placing the appropriate logic level on a corresponding one of the input lines as shown at 41–46. The selected layer will be the one for which the signal is coupled to input pad 3, i.e., the select line pad on each layer. For example, a signal placed on input line 41 will be coupled to input pad 3 of layer 3, and hence, select that layer. While this signal appears at each layer, it does so on input pads other than pad 3. Similarly, a signal placed on line 44 will be coupled to input pad 3 of layer 6. A signal placed on line 46 is coupled to input pad 1 of layer 2 and eventually connects to an input pad 3 at layer 4 which is not shown in the drawing.

The above-described embodiment of the present invention utilized a specific choice for the input pad that connected to the layer select line. However, it will be obvious to those skilled in the art from the preceding discussion that the precise choice of input pad is not important so long as the same pad is used on each layer. Furthermore, it will be obvious from the preceding discussion that the select line could just as easily be connected to one of the output pads. However, since each output pad is connected to a corresponding input pad, such an arrangement is equivalent to connecting the select line to a predetermined input pad.

It should be noted that the address select lines are all the same length in the above-described embodiments of the present invention. That is, the signal path from the beginning of each address select line to the last output pad connected to that line is the same independent of the line number. This is particularly important in high-speed systems, since the line driver that places the signal on the select lines will always be connected to the same impedance independent of the line selected. Hence, there will be no variation in signal propagation time between the various address select lines because of differences in impedance. Accordingly, more tightly controlled timing sequences can be utilized.

The above-described embodiments of the present invention utilized a connection scheme in which the $k^{th}$ input pad was connected to the $(k+1)^{st}$ output pad on each layer with the last input pad being connected to the first output pad. However, it will be obvious to those skilled in the art from the preceding discussion that other connection schemes can be utilized. For an input pad to output pad mapping to work satisfactorily, three conditions must be met. First, each select line must pass through precisely one input pad on each layer. Second, the position of that pad must be different for each layer position, and third, each input pad position must be visited once in a fully populated stack. To satisfy these requirements there must be a one-to-one mapping between the input pads and the output pads on each layer and no input pad can be connected to an output pad at the same location. The scheme discussed above is preferred because the connections between the input pads and output pads are more easily constructed.

It should be noted that, while there must be one input pad-output pad pair for each possible layer in the stack, not all of the layers need to be present. Hence, the input-output pad configuration needs only to be designed for the maximum number of layers. That is, if the maximum number of layers is to be N, each layer must have N input pads and N output pads. These layers can then be utilized in any stack having N or fewer layers without any alteration of the layers. However, if a partially populated stack is to be utilized, then the choice of which input pad is used as the address select line becomes significant, as only one such choice will yield identical paths for possible partially populated arrangements. In the embodiment shown in FIGS. 1 and 2, input pad 6 would need to be the pad to which the select line 30 is connected to assure that stacks having less than 6 layers all presented select lines of the same length to the driving circuitry.

The present invention may be applied to any layered system. Hence, it may also be utilized in systems constructed from a plurality of circuit boards or larger layers or in systems constructed from integrated circuit chips.

The above-described embodiments of the present invention have referred to input and output pads that are shown as conductors that are larger than the electrical conductors connected thereto. However, it is to be understood that the term "pad" applies to any conducting area on a circuit layer to which an electrical connection can be made.

Various modifications to the present invention will become apparent to those skilled in the art from the foregoing description and accompanying drawings. Accordingly, the present invention is to be limited solely by the scope of the following claims.

What is claimed is:

1. An integrated circuit comprising first and second identical layers of circuitry, each layer comprising:
   a substrate having a plurality of components thereon;
   circuit selection circuitry comprising circuitry for enabling said integrated circuit to perform a predetermined function, said circuitry including a circuit selection terminal for receiving a signal that enables said predetermined function;
   N input pads labeled with a value k that runs from 1 to N, where N>1; and
   N output pads labeled with a value k that runs from 1 to N, each input pad being connected to a corresponding one of said output pads, such that there is a one-to-one mapping between said input pads and said output pads, said label of each input pad being different from said label of said output pad to which that input pad is connected,
   wherein said input pad labeled k on said second layer is connected to said output pad labeled k on said first layer for k=1 to N.

2. The integrated circuit of claim 1 wherein said input pad labeled k is connected to said output pad labeled k+1 for k=1 to N−1 and said input pad labeled N is connected to said output pad labeled 1.

3. The integrated circuit of claim 1 further comprising first and second layer select terminals for coupling said signal enabling said predetermined function to said circuit selection terminals in said first and second layers, respectively, said first layer selection terminal comprising a first one of said input pads on said first layer and said second layer select terminal comprising a second one of said input pads on said first layer.

4. The integrated circuit of claim 3 wherein the electrical impedance from said first and second layer select terminals to said output pads on said second layer is substantially the same.

* * * * *